United States Patent [19]
Chopard et al.

[11] 3,993,985
[45] Nov. 23, 1976

[54] INDICATOR FOR THE CONDITION OF A BATTERY OPERATING A TIMEPIECE

[75] Inventors: Rémy Chopard, Neuchatel; Hubert Portmann; Eric Saurer, both of Hauterive, all of Switzerland

[73] Assignee: Ebauches S.A., Neuchatel, Switzerland

[22] Filed: Apr. 29, 1974

[21] Appl. No.: 465,347

[30] Foreign Application Priority Data
May 10, 1973 Switzerland.................... 6627/73

[52] U.S. Cl. ............................ 340/249; 58/23 BA; 324/29.5; 340/248 B
[51] Int. Cl.²........................................ G08B 21/00
[58] Field of Search ............ 340/249, 248 A, 248 B, 340/248 R, 336, 309.2; 324/29.5; 136/182; 58/23 BA

[56] References Cited
UNITED STATES PATENTS

| | | | |
|---|---|---|---|
| 3,392,379 | 7/1968 | Thomason et al. | 340/213.1 |
| 3,432,743 | 3/1969 | Ford | 323/3 |
| 3,597,729 | 8/1971 | Lopez | 340/52 F |
| 3,653,745 | 4/1972 | Mao | 350/160 R |
| 3,670,246 | 6/1972 | Gately | 324/133 |
| 3,702,469 | 11/1972 | Golja | 340/248 A |
| 3,750,140 | 7/1973 | Gray | 340/336 |

Primary Examiner—Donald J. Yusko
Assistant Examiner—James J. Groody
Attorney, Agent, or Firm—Imirie, Smiley & Linn

[57] ABSTRACT

The present invention relates to an indicator for the condition of a battery and more particularly for a battery with voltages between 1 and 3 Volts. The indicator comprises an electronic device in which a stable reference voltage is provided by a semi-conductor device compensated in temperature by the combination of a diode voltage with a multiple of the difference between two other diode voltages, and a positive feedback circuit which drives a passive display device according to the condition of the battery.

7 Claims, 8 Drawing Figures

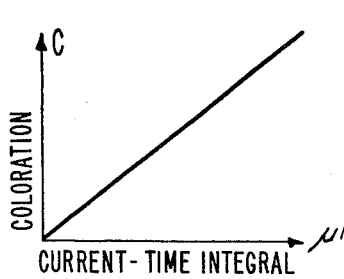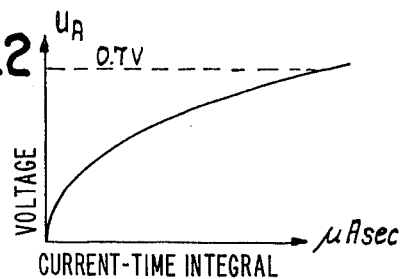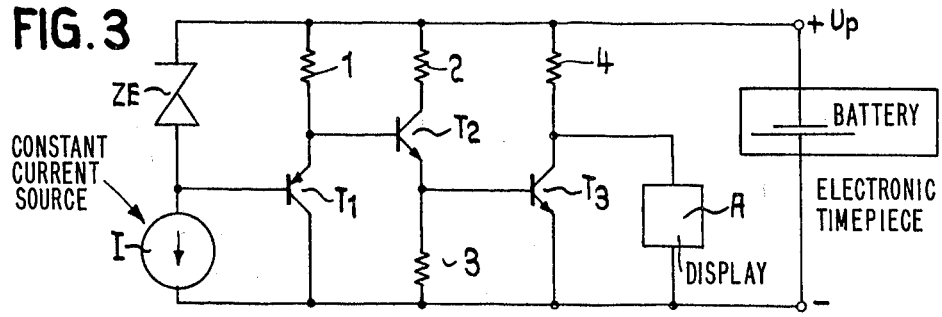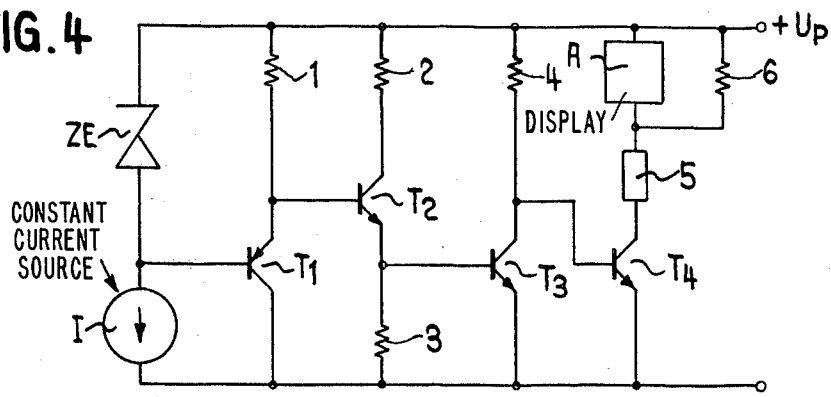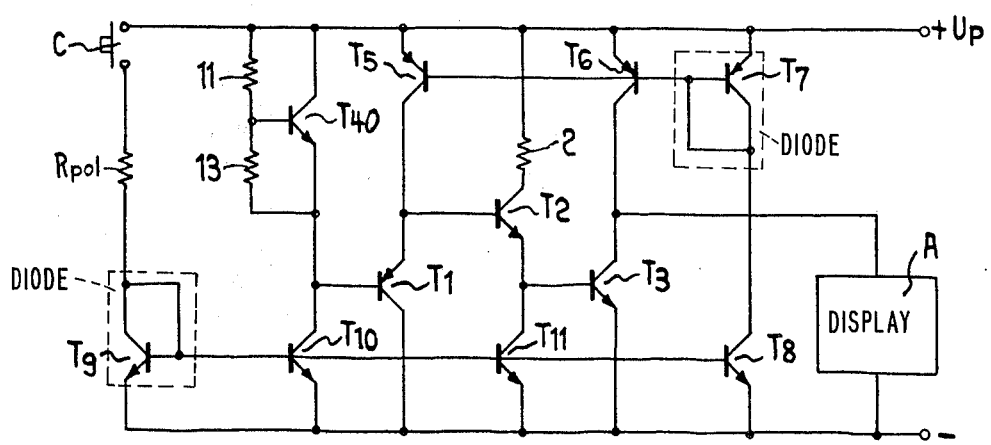

INDICATOR FOR THE CONDITION OF A BATTERY OPERATING A TIMEPIECE

BACKGROUND OF THE INVENTION

The present invention concerns an indicator signalling the approach of the end of life of a battery operating a timepiece.

There is already in existence, for example on pocket calculators, an indicator showing the user that the operating battery voltage is becoming too low; this indication may be given by the simultaneous illumination of all the decimal points of the display system. In certain timepieces an indicator has been provided which emits a visible signal as long as the battery is in a good state; the signal ceases when the battery voltage becomes too low.

In the first case, the use of light-emitting diodes has the disadvantage that the battery, already becoming exhausted must furnish energy not only to the apparatus itself but also to the indicator system, which further shortens the life of the battery. In the second case it is clear that the length of life of the battery may be seriously reduced because the display indicating the state of the battery is visible during the whole of the duration of the life of the battery. There are also electronic devices adapted to detect the moment where the voltage of the battery falls below a predetermined limit. They are however used for relatively high voltages and do not lend themselves readily to use in wristwatches.

SUMMARY OF THE INVENTION

The present invention is applicable to battery voltages between 1 and 3 volts.

The invention proposes to resolve the problem by the use of a passive display necessitating only very little current to furnish a visible signal. This passive display is distinguished from an active display by the fact that the elements from which it is composed do not emit any light, but become progressively opaque or transparent, as in the case of liquid crystals, or change color under the effect of an electric field. This phenomenon of change of color which is called "electrochromism" forms the subject of U.S. Pat. No. 3,521,941. The present specification describes devices using electrochromatic materials. In particular, certain devices based on the principal of electrochromism are known which respond to voltages less than 1 V to become operative. These can be used to monitor devices wherein a single cell having a voltage of 1.5 is employed. An indication of battery failure can be given even when the apparatus concerned does not receive enough energy to make it continue to work. The said devices permit the use of extremely low currents of the order of several tens of nanoamperes, though the optical indication furnished under such circumstances can only appear relatively slowly.

The device permits the use of liquid crystals the behavior of which is analogous to that of the electrochromatic materials in that the currents and voltages employed are low. Devices are known using liquid crystals which react to voltages of 1 V, and although their response time is relatively long, they can readily be used in an indicator signalling the approaching end of the life of a battery.

The invention provides an electronic circuit capable of operating a display device advising the user that a battery must be changed without delay, and incorporating a temperature compensating circuit, the principle of functioning of which is as follows:

A definite multiple of a voltage representing the difference between the two voltages of a diode, polarised at different currents is added to a voltage for the diode, the thermal coefficient of which is negative. This difference is well defined and its thermal coefficient is positive, so that it can thus compensate the negative thermal coefficient of the voltage of the diode.

BRIEF DESCRIPTION OF THE DRAWINGS

FIG. 1 is a diagram illustrating the state of coloration C for a given current-time integral in a passive display element which can be used in the invention;

FIG. 2 is a diagram showing the rise of voltage across the element against the current-time integral;

FIGS. 3 and 4 are schematic diagrams of circuits according to the invention;

FIG. 5 is a schematic diagram of a circuit which can be made in integrated form;

DETAILED DESCRIPTION OF PREFERRED EMBODIMENTS

Figure 6:
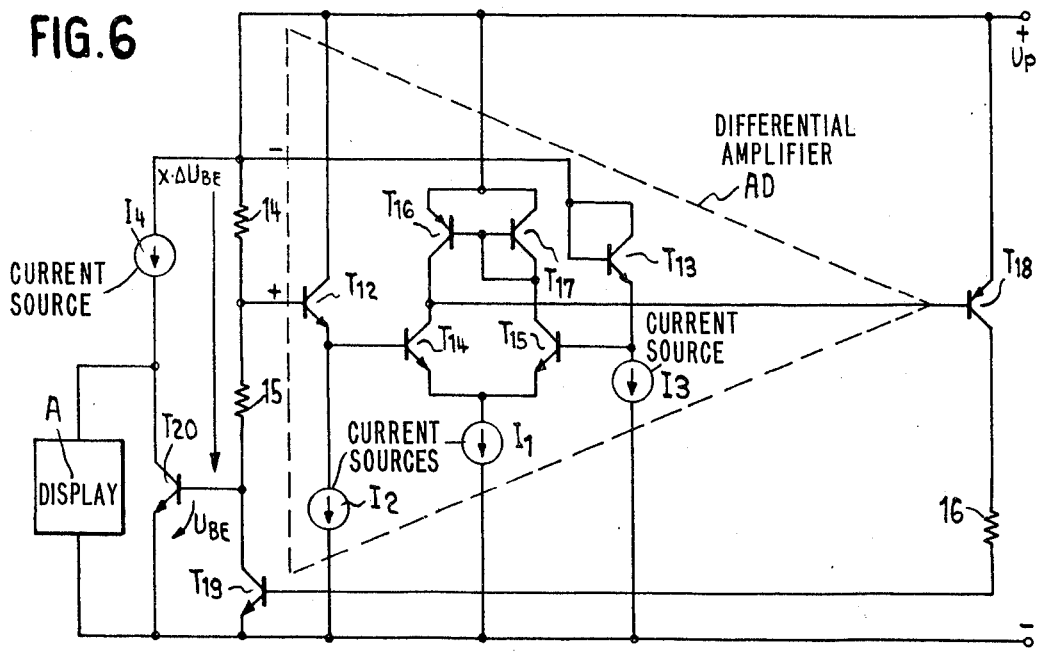
FIG. 6 is a schematic diagram of a thermally compensated circuit.

The circuit of FIG. 3 shows a first PNP transistor T1 the base of which is connected to the anode of a Zener diode ZE the cathode of which is connected to the positive terminal Up of a battery B which feeds certain apparatus. This same base is connected by a source of constant current I to the negative terminal of the battery. The collector of T1 is directly connected to the negative terminal in a common collector mode, and its emitter is connected via a resistor 1 to the positive terminal. The junction is connected to the base of a second NPN transistor T2 the emitter and collector of which are connected respectively to the negative terminal via resistor 3 and to the positive terminal by a resistor 2. The transistor T2 is also operated in a common collector mode and its emitter is connected to the base of a third NPN transistor T3 the emitter of which is connected directly to the negative terminal and the collector to the positive terminal via a resistor 4. The display device A is connected between the collector of T3 and the negative terminal of the battery.

The functioning of the device of FIG. 3 is as follows:
The voltage on the base of transistor T1 is $$U_p - U_z,$$

where $U_p$ is the voltage at the positive terminal of the battery and $U_z$ the drop of voltage across the Zener diode ZE. This voltage is repeated at the base of transistor T2, plus $U_{BE1}$, the base-emitter voltage of T1, $$\text{or } U_p - U_z + U_{BE1}. \qquad 1.$$

Transistor T2 conveys this voltage, from which there is subtracted the base-emitter voltage $U_{BE2}$ of T2 to the base of T3. This voltage is $$U_p - U_z + U_{BE1} - U_{BE2} \qquad 2.$$

If $U_{BE3}$ is the voltage on the base of T3 when T3 becomes conductive, it follows that $$U_p - U_z + U_{BE1} - U_{BE2} \geq U_{BE3} \qquad 3.$$

If now the voltages $U_{BE}$ of the three transistors T1, T2 and T3 are the same, $$\text{i.e. } U_{BE1} = U_{BE2} = U_{BE3} = U_{BE} \qquad 4.$$

$$\text{then } U_p - U_z \geq U_{BE} \qquad 5.$$

With $U_z$ remaining relatively constant, a condition is obtained for the voltage of the battery $U_p$ such that $$U_p \geq U_z + U_{BE} \qquad 6.$$

It therefore follows that if the voltage $U_p$ is sufficiently great, T3 will conduct, shortcircuiting the element A. If not, T3 will become nonconductive.

From FIG. 1, it will be seen that as regards display element A, the coloration C is a linear function of the charge (time integral of current) in the element A. This latter acts as a capacitor.

FIG. 2 shows the relation between voltage $U_A$, across the element A, as a function of its state of charge. The voltage $U_A$ stabilises itself at a level which, for certain elements, is about 0.7 V: This has advantages in apparatus provided with low voltage batteries. The graph shows that to obtain a certain degree of coloration, there is a lapse of time which depends on the current passing in the element A. If, for example, in the device of FIG. 3, the conditions of equation (6) above are fulfilled, no current will pass through the element A, and if the capacitor were charged, it would discharge itself, rapidly through transistor T3. If on the contrary the voltage $U_p$ becomes insufficient and $$U_p < U_z + U_{BE} \qquad 7.$$

the transistor T3 opens, permitting the element A to charge through resistor 4. This resistor cooperates to determine the time necessary to produce a suitable coloration. This time can be made several seconds, several minutes or even several hours.

In the case where the display element is a liquid crystal cell, T3 when open, will allow the excitation of the cell which is connected via resistor 4 to the positive terminal of the battery. With T3 conductive, the voltage across the cell will be negligible, and it will thus not be excited.

The inconvenience of exciting the liquid crystal cell with a continuous voltage (rather than alternating) is not very serious, as the voltage applied is very small and the duration of use is very limited (only a few days per year).

With such a liquid crystal device, there is no means of varying the speed of appearance of the indication, which is practically instantaneous. The indication does not remain if the indicating circuit is disconnected, or if the voltage of the battery rises, or if it is replaced.

In certain apparatus, especially timepieces, the mechanism is driven by impulses during which the current consumption is high; it could be that during these impulses, the voltage of the battery becomes critical, i.e. falls below an admissible value, whilst it rises above this value between the impulses. The slow coloration and the rapid discoloration obtained with the circuit of FIG. 3 detects only the maximum of the voltage of the battery; if the voltage of the battery between the impulses is above the minimum admissible voltage, no indication would be given.

The contrary is the case in the circuit of FIG. 4 where there is a Zener diode ZE, a source of current I, transistors T1, T2 and T3 as well and resistors 1, 2, 3 and 4, the arrangement of which is the same as in FIG. 3. The base of a fourth NPN transistor T4 is connected to the collector of transistor T3, and its emitter is connected to the negative terminal, whilst its collector is connected via resistor 5 is connected to a parallel circuit including the display element A and a resistor 6, both of which are connected to the positive terminal $+U_p$ of the battery.

As noted above, transistor T3 is conducting or open depending on the voltage $U_p$. Since transistor T3 acts in a common-emitter mode, transistor T4 is open when transistor T3 is conducting, and is conducting when transistor T3 opens. As in the circuit of FIG. 3, coloration of the element A takes place if the battery voltage is insufficient, and no coloration occurs if the battery voltage is adequate. The circuit of FIG. 4 differs from that of FIG. 3, however, in that the cell charging current and the coloration of the element A can be varied by resistor 5, and its discharge current or discoloration by the resistor 6. Thus the time of coloration and of discoloration can be regulated to any desired values.

In the apparatus mentioned above, which is driven by high-current impulses, the circuit of FIG. 4 can be such by suitable dimensioning of resistors 5 and 6 that the element A colors rapidly and discolors slowly, so that an indication is obtained of the minimum value of the voltage $U_p$: this is preferable, since the approaching end of the life of a battery is characterized by an increase in the internal resistance and a consequent drop in voltage during the impulses. This circuit provides an indication of the internal resistance of the battery. This will reveal a bad battery having too great an initial internal resistance, and it will also indicate if the temperature of the battery is too low since this produces an increase of internal resistance as well. An indication may also be given if the circuit develops a fault.

It may be advantageous to provide only a periodic indication as a result of a signal given by the apparatus, or an indication may be given only at times chosen by the user. To this end, FIG. 5 shows a contact C which can be closed automatically or manually, to test the battery at desired periods only. The circuit of FIG. 5 can be of integrated form, and to this end the resistors having terminals connected to one of the poles of the battery are replaced by sources of current. In FIG. 5 transistors T1, T2 and T3 correspond to similarly designated ones in FIGS. 3 and 4. The Zener diode of the preceding circuits has been replaced by transistor T40 the collector of which is connected to the positive terminal. Its base is also connected to this same terminal via resistor 11, and also to its emitter via resistor 13: the circuit including the elements 11, 13 and T4 acts as an amplifier of the base-emitter voltage. There is a polarization resistor $R_{pol}$ which, when indication is required, is connected to the positive terminal by contact C. It is also connected to transistor T9 acting as a diode, since its base is short-circuited to its collector which is the anode, and its emitter the cathode. This diode is connected to the negative terminal. The base of transistor T9 polarizes current regulators T10, T11 and T8. Transistor T10 represents the source of current I of FIGS. 3 and 4, and T11 replaces resistor 3 in the same Figures.

Transistor T8 the emitter of which is connected to the negative terminal of the battery and the base to the base of transistor T9, has its collector connected to the diode connected transistor T7 the emitter of which is connected to the positive terminal and draws current through this diode which at its base polarizes transistors T5 and T6 which replace respectively the resistors 1 and 4 of FIGS. 3 and 4. The resistor 2 remains in the collector path of transistor T2 and the display element A remains between the collector of transistor T3 and the negative terminal of the battery.

The operation of this circuit is the same as that of the circuit of FIG. 3. It should be noted that all the current regulators are activated from a single resistor $R_{pol}$, which can be internal or external; this ensures correct current values in the various branches of the circuit. Opening of contact C thus cuts off all current to the circuit, but the state of coloration of the cell A is retained if this is of the electrochromatic type.

The ambient temperature affects not only the battery but also the circuit itself, and this influence is great since the voltages used are small. The effects of temperature changes can be compensated by using the circuit of FIG. 6.

Transistors T14, T15, T16, T17 and constant current regulator I1 form a conventional differential amplifier, the inputs of which are connected to the emitters of transistors T12 and T13. These two transistors carry currents predetermined by the regulators I2 and I3. If for example, I2 is much smaller than I3, the base-emitter voltage of T12 is smaller than the base-emitter voltage of T13. This effect can be reinforced by the choice of larger values for transistor T12, traversed by a small current and smaller values for T13, traversed by a larger current. The respective collectors of transistors T12 and T13 are connected to the positive terminal of the battery and the base of T13 is connected to its collector, whilst the base of T12 is connected between two resistors 14 and 15 of which one (14) is connected to the positive terminal, the other to the collector of a transistor T19 the emitter of which is connected to the negative terminal of the battery. The collector of transistor T14 is connected to the base of transistor T18 the collector of which is connected to the positive terminal, and the emitter is connected via resistor 16 to the base of transistor T19. To complete the circuit it is necessary to add a last stage. Alternatively the circuit T3, T4, resistors 4, 5, 6 and A of FIG. 4 can be used. The current I3 is very much greater than current I2, as determined by an appropriate choice of transistors forming the regulators I2 and I3. The different base-emitter voltages are applied to the differential amplifier T14, T15, T16, T17, I1 which regulates, with T18 and resistor 16, the conduction of transistor T19. This latter transistor T19 allows current to pass through the resistors 14 and 15 of such a value that the drop of voltage on resistor 14 compensates for the difference in voltages of the base-emitter voltages of the transistors T12 and T13. Thus the voltage drop across resistor 14 is the difference $\Delta U_{BE}$ between the base-emitter voltages of transistors T12 and T13. In accordance with the ratio of the values of the resistance 14 and 15 there will be obtained as the voltage drop rate across the two resistors 14 and 15 is $X \cdot \Delta U_{BE}$ (8)

where $X = 1 + \dfrac{R15}{R14}$ and R15 and R14 are the respective values of resistors 15 and 14.

To this voltage $X\Delta U_{BE}$ there is added the base-emitter voltage of transistor T20, if the circuit between the positive terminal and the negative terminal includes a Zener diode voltage of transistor T20. The circuit between the positive terminal and the negative terminal has characteristics of a Zener diode, the breakdown voltage of which $(X.\Delta U_{BE} + U_{BE})$ is well defined and stable with regard to the temperature. Above this voltage, transistor T20 is conductive, short-circuiting the display element A; below this voltage it is open and a current I4 passes into the display element A.

It has been assumed that the differential amplifier T14, T15, T16, T17 was symmetrical, but the same procedure can be used as for transistors T12 and T13. If T16 is of smaller current carrying capacity than T17, the current through T14 will be smaller than that through T15, so that there is a second voltage difference introduced. This effect can be accentuated by the choice of larger dimensions for T14 than for T15. T12 and T14 have base-emitter voltages which are smaller than those of transistors T13 and T15 and this difference of voltage will appear across resistor 14. Thus the circuit comprises a differential amplifier AD the gain of which is controlled by the resistors 14 and 15 and amplifying its own offset-voltage which has been chosen to be very large. The voltage appearing across the two resistors 14 and 15 can be expressed as follows:

$$[(U_{BE13} - U_{BE12}) + (U_{BE15} - U_{BE14})] (1 + \dfrac{R15}{R14}) \qquad (9)$$

were $U_{BE12}$, $U_{BE13}$, $U_{BE14}$ and $U_{BE15}$ are respectively the base-emitter voltages of transistors T12, T13, T14 and T15.

Figure 7:
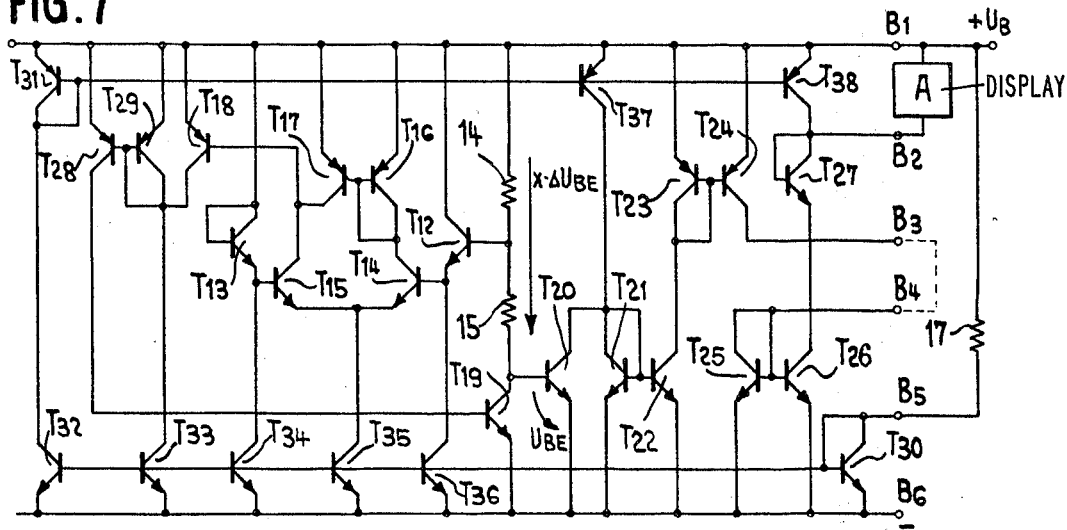
FIG. 7 is a schematic diagram of an integrated temperature compensated circuit.

FIG. 7 shows how a circuit can be made of entirely integrated form. It is not necessary to describe this circuit in detail. Thus transistors T12, T13, T14, T15, T16, T17 form the differential amplifier, resistors 14 and 15 across which appear the voltage $X \Delta U_{BE}$ the temperature coefficient of which is positive, and transistors T18, T19 and T20. Resistor 16 is replaced by transistors T28 and T29 which precede transistor T19. The exterior polarization resistor 17 supplies current to the transistor T30 connected as a diode, and supplying a constant voltage to the current regulators T32, T33, T34, T35 and T36. Transistor T31 connected as a diode and in series with regulator T32, polarizes the regulators T37 and T38. Terminals B1, B2, B3, B4, B5 and B6 are the only terminals of the integrated circuit.

The operation of the circuit of FIG. 7 is in principle, the same as that of the preceding examples. However, this circuit can provide simultaneous indication of the state of two batteries, which can either be connected in series or in parallel.

For a single battery, terminals B3 and B4 are short-circuited (indicated in broken lines), B1 is connected to the positive terminal of the battery, the display element is connected between terminals B1 and B2, the exterior bias resistor between terminals B1 and B5, and B6 is connected to the negative terminal of the battery.

If the voltage of the cell $U_p$ is sufficient, transistor T20 is conductive; consequently the transistors of the following stages: T21, T22; T23, T24; T25, T26 are open and the display element A is not colored.

If on the contrary the voltage of the cell is insufficient i.e. if it falls below the bias voltage;

$$X \cdot \Delta U_{BE} + U_{BE} \qquad 10.$$

transistor T20 is opened; the current furnished by the regulator T37 now passes through transistor T21, which turns on T22: subsequently T23, T24, T25, T26 are turned on and conduct, allowing the display element A to receive current and become colored.

Figure 8:
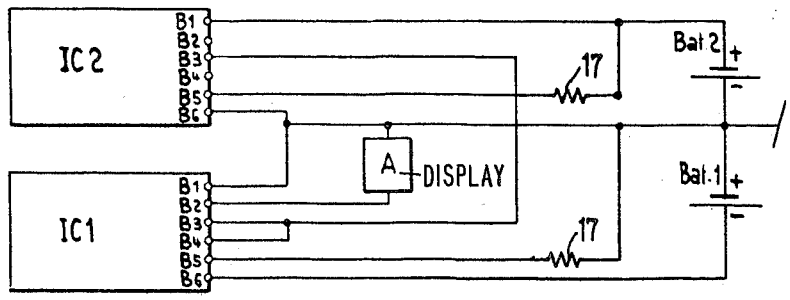
FIG. 8 is a schematic diagram, partially in block form, which shows how the condition of two series-connected batteries can be indicated.

FIG. 8 shows how the simultaneous indication of the condition of two batteries in series can be effected by using two circuits in accordance with FIG. 7. These circuits are IC1 and IC2, each of which indicates the condition of one of the batteries Bat1 and Bat2. Terminal B3 of the circuit IC2 is connected to terminals B3 and B4, themselves short-circuited, of the circuit IC1 which alone operates a display element A. Transistor T24, the circuit IC2 and transistors T24, T25 and T26 of the circuit IC1 form an "or" gate operating a single display circuit T27, T38 and A.

Here transistor T27 of FIG. 7 connected as a diode is not essential for the operation of the circuit. Its role is to limit the voltage which can appear at the terminals of the display element A, where this is of the electrochromatic type, thus avoiding too much coloration. On the other hand it prevents the discharge of the electrochromatic element in the case where the voltage of a battery has fallen to zero. The current passing through transistor T26 is practically independent of the emitter-collector voltage thereof.

If the batteries are in parallel, connections are the same as before. Terminals B3 and B4 of the first circuit respond to the condition of the first battery and operate the display element A as short-circuited. Terminal B3 and the second circuit indicate the condition of the second battery and is connected to the terminals B3, B4 of the first circuit (FIG. 8).

These circuits do not give an indication as to which of the two batteries is to be replaced: in the case of a coloration of the indicating cell, it would be necessary to replace both batteries.

It is clear that the operative characteristics of the circuits of FIGS. 3, 4 and 5, concerning speeds of coloration, discoloration and periodic control, can be applied to the circuit of FIG. 7.

The invention has many applications outside the field of timepieces. Thus it can be used for a pocket calculator, to indicate the state of the battery and to avoid possible calculation errors, or, in any other battery-driven apparatus the operation of which must not be interrupted.

What we claim is:

1. In an electronic timepiece including a battery power source the voltage of which is not greater than three volts and a sensor circuit having its supply terminals connected to the terminals of the power source, the improvement wherein said sensor circuit comprises: two resistors connected in series; semi-conductor means coupled to said two resistors and said source for establishing a first voltage signal across one of said resistors; a first transistor acting as a current source having its collector-emitter current path connected in series with said resistors, the series circuit comprising said two resistors and said first transistor being coupled across said battery power source whereby a multiple of said first voltage signal appears across the two resistors and acts as a reference voltage and the difference between the power source voltage and said reference voltage appears across said current source; a display device; and actuating means supplied by said power source and responsive to the voltage appearing across said current source for energizing said display device when the voltage appearing across said current source falls below a voltage threshold.

2. A circuit according to claim 1, wherein said semiconductor means comprises a second transistor having its emitter and collector connected respectively by one of said resistors to its base so as to form a base-emitter voltage multiplier; and further including a polarization resistor, and a third transistor having its collector connected to its base and through said polarization resistor to a terminal of said battery, and its emitter connected to the other terminal of said battery, the voltage across said polarization resistor being coupled to the base of said first transistor for controlling said first transistor.

3. A circuit according to claim 1, wherein said semiconductor means comprises a differential amplifier, the thermal coefficient of which is positive, said resistors being coupled to said differential amplifier to form a feedback circuit controlling the gain of said differential amplifier; and wherein said actuating means includes a transistor having a base-emitter voltage, the thermal coefficient of which is negative, said current source having its base controlled by the output of said differential amplifier whereby voltage variations with temperature at the differential amplifier output compensate for the base-emitter voltage variations of said actuating means transistor.

4. A circuit according to claim 1, wherein said display device comprises an electrochromic display; and wherein said actuating means includes means connected to said display device for separately determining the speed of coloration and the speed of decoloration of said electrochromic display.

5. A circuit according to claim 1, wherein one of the terminals of said sensor circuit is connected to the battery through a switch.

6. A circuit according to claim 1, wherein said actuating means comprises an electronic switch connected in parallel with said display device.

7. A circuit according to claim 1, including two batteries and a second sensor circuit connected to said display device, said first and second sensor circuits being connected to said two batteries, respectively, to check independently the condition of the two batteries by means of a single display device.

* * * * *